(12) United States Patent
Patterson, Jr.

(10) Patent No.: US 6,915,186 B2
(45) Date of Patent: Jul. 5, 2005

(54) SYSTEM AND METHOD FOR SYNCHRONIZING ELECTRICAL GENERATORS

(76) Inventor: Frank Patterson, Jr., Rte. 1, Box 121, Woodward, OK (US) 73801

( * ) Notice: Subject to any disclaimer, the term of this patent is extended or adjusted under 35 U.S.C. 154(b) by 318 days.

(21) Appl. No.: 10/214,247

(22) Filed: Aug. 7, 2002

(65) Prior Publication Data

US 2004/0025496 A1 Feb. 12, 2004

(51) Int. Cl.$^7$ .............................................. G05D 11/00
(52) U.S. Cl. ....................................... 700/286; 323/244
(58) Field of Search ................................ 700/286, 287, 700/292, 293, 294, 296; 324/500; 323/212, 235, 244

(56) References Cited

U.S. PATENT DOCUMENTS

| | | | |
|---|---|---|---|
| 5,642,006 A | | 6/1997 | Cech |
| 6,397,157 B1 | * | 5/2002 | Hogle et al. ................... 702/65 |
| 6,522,030 B1 | * | 2/2003 | Wall et al. ..................... 307/43 |
| 2003/0184275 A1 | * | 10/2003 | Slade et al. .................... 324/66 |

FOREIGN PATENT DOCUMENTS

WO        WO 01/93401 A1    12/2001

OTHER PUBLICATIONS

Yunping, Chen, et al., "A New Approach to Real Time Measurement of Power Angles of Generators at Different Locations for Stability Control," IEEE, p. 1237–1242, (2000).

Ota, Y. et al., "Evaluation of Stability and Electric Power Quality in Power System by Using Phasor Measurements," IEEE, p. 1335–1340, (2000).
Martin, K.E., "Precise Timing in Electric Power Systems," IEEE International Frequency Control Symposium, IEEE, p. 15–22, (1993).
Wilson, R.E., "Uses of Precise Time and Frequency in Power Systems," IEEE, vol. 79 (No. 7), p. 1009–1018, (1991).
Nouri, H., et al., "An Accurate Fault Location Technique for Distribution Lines With Tapped Loads Using Wavelet Transform," IEEE, p. 4, (2001).
Kazuo, A., et al., "Fault Location for Power Cable Using Global Positioning System—FLAG –," Fujikuru Technical Review, p. 73–76, (2002).
Radovanovic, A., "Using the Internet in Networking of Synchronized Phasor Measurement Units," International Journal of Electrical Power & Energy Systems, vol. 23 (No. 3), p. 245–250, (2001).

* cited by examiner

Primary Examiner—Leo Picard
Assistant Examiner—Zoila Cabrera
(74) Attorney, Agent, or Firm—Fellers, Snider, Blankenship, Bailey & Tippens, P.C.

(57) ABSTRACT

A system and method for synchronizing a remote generator to a bus, whether or not power from the bus is available at the generator. The system includes: a first clock at a host site; a host timing processor for determining the time of a synchronizing event; a communication channel for transmitting the time to a remote site; a second clock at a remote site synchronized to the first clock; and a remote timing processor for receiving the time of a synchronizing event, comparing the time of the event to the time of a similar event at the generator, and adjusting the speed of the generator to synchronize the generator to the bus.

6 Claims, 5 Drawing Sheets

SYSTEM AND METHOD FOR SYNCHRONIZING ELECTRICAL GENERATORS

BACKGROUND OF THE INVENTION

1. Field of the Invention

The present invention relates to a system and method for synchronizing remote generators. More particularly, but not by way of limitation, the present invention relates to a system for synchronizing a generator to a synchronous bus without the need to have the synchronous bus available at the generator.

2. Background of the Invention

Generally speaking, a power plant uses generators rotated by steam, water, or an engine to produce electrical energy in the form of three-phase alternating current of a fixed voltage and a fixed frequency. Electricity so produced is then delivered to consumers through a network of transformers and transmission lines often referred to as a power distribution grid, or just the "grid." Within the grid of a single utility company, power generation will often be distributed among several power plants to reduce distribution costs and to improve the reliability of the system. With multiple generators operating, a customer need not lose electrical power simply because a single generator has been taken off-line.

In addition, adjoining utility companies often interconnect their individual grids to create a larger grid. In such an arrangement, if one company under-produces power, it may purchase power from its neighboring company rather than interrupt service. At the extreme, virtually every utility company in a country may be connected to its neighboring grids to create a national power grid. As a result, an under-producing company can look nearly anywhere in the country to find an overproducing company from which to purchase power.

As is well known in the art, a generator can only be connected to a common electrical bus, or grid, if turning in synchronization with other generators already on the grid. Synchronization requires that the generators are producing alternating current at the same frequency, and that the outputs of the generators are in phase with one another. If both conditions are not met, extremely large electrical currents will flow through the generators, potentially tripping circuit breakers within the network, or even damaging equipment. If a national grid is in place, ideally every generator on the grid, across the entire country, should be turning in synchronization.

Typically, before a generator is placed on line, electrical power from the grid is present at the power plant, right up to the contacts that tie the generator to the grid. Thus, the generator may be synchronized to the power already present on the grid prior to making the connection to the bus. Unfortunately, if power is not already present at the power plant, there is presently no method for synchronizing the generator to active portions of the grid. For example, after a disaster, i.e. a hurricane, tornado, flood, earthquake, or the like, substantial portions of a grid may be damaged and a generator within a damaged area may be isolated from the rest of the grid. While such a generator could be placed on-line to supply its local area with electricity, sections of the grid powered by the generator can not be reconnected to the grid without first taking the generator back off-line since the generator would be operating asynchronous to the grid.

In many instances, a utility will simply not place a generator back on line until synchronization is possible. As a result, customers may be without electricity for undue periods simply because grid power has not been restored to a nearby power plant. If remote synchronization was available, the power cold be restored to such areas as local repairs were made.

In addition to the problem of synchronizing a generator to a bus at startup, maintaining synchronization while running is also of concern. Unfortunately, it is presently impossible to ascertain with certainty whether or not the generator remains in synchronization with the bus. Obviously, if power is monitored at the power plant, the wave form will be most influenced by the local generator, or generators, rather than power on the bus from other sources. Thus, frequency and phase regulation are more likely due to the tendency of the generator to act as a motor when under-producing and the restrictive load placed on the generator when over-producing than to presently used synchronization systems.

Once a generator is on-line, the mechanical input is typically adjusted to maintain a rate of generation roughly equal to the expected usage. Typically, this level of generation is scheduled. As a result, under demand results in overgeneration which translates into losses for the generating company. In some instances, overgeneration can actually push the generator out of synchronization with the bus, causing a phenomenon known as inadvertent interchange wherein electrical power is unintentionally transferred from one utility company to another over the grid. Unfortunately, at the power plant, the power losses associated with over-generation are difficult to distinguish from legitimate load.

One method to prevent over or under generation is to measure actual usage, in real time, for each consumer. Such a method requires a telemetric electric meter at each residence and business served by the utility. Even if such meters were already in place, presently there is no infrastructure for sending such an enormous amount of information back to the power plants in a timely manner to allow meaningful control of the generators. Another possibility would be to measure power transfer at each point where the utility ties to another grid. While this method would reduce the incidence of inadvertent interchange, it does not distinguish between losses caused by lapses in synchronization versus dynamic changes in the actual loads both on the local grid and across the boundaries with neighboring grids.

It is also well known in the art that a fault in a power transmission line causes a disturbance on the power line. Such disturbances can be observed with proper equipment even miles away from the fault. Capturing such faults with a power line monitor is well known in the art. In fact, such disturbances may be captured at multiple locations with multiple power line monitors. Unfortunately, while the existence of the fault may be indicated, there is presently no means for determining the location of the fault with such monitors. If, however, real time clocks in two are more monitors were precisely synchronized, it would be possible to log the time of arrival of a disturbance at each monitor and calculate the position of the fault in the transmission line by the differences in the times of arrival. As will be appreciated by those skilled in the art, since disturbances travel at the speed of light along the transmission line, even minute differences in the real time clocks of different monitors would result in unacceptable errors in the calculation of a location.

It is thus an object of the present invention to provide a system and method for synchronizing a generator to a bus even when power from the bus is not available at the generator.

It is a further object of the present invention to provide a system and method for maintaining synchronization of two or more interconnected generators.

It is still a further object of the present invention to provide a system and method for recording the precise time of the arrival of a power line disturbance such that, when such a time is recorded at two or more locations, a distance to the source of the disturbance may be calculated.

SUMMARY OF THE INVENTION

The present invention provides a system and method for synchronizing an electrical generator to a synchronous bus whether a connection to the bus is available at the generator, or not, and maintaining accurate synchronization after connection. Preferably the inventive system includes: a host timing processor at a host site for producing reference time codes corresponding to zero crossings on a synchronous bus; a communication channel for transmitting the time code of reference zero crossings to a generator at a remote site; a GPS receiver at the remote site for receiving GPS time codes to allow calculation of absolute time; and a remote timing processor for synchronizing generated zero crossings with the time codes of reference zero crossings. Synchronization may be maintained on a continuous basis as opposed to just during startup.

In a preferred embodiment, the timing host processor connects to a power grid and, upon periodic zero crossings of the AC voltage, reads the GPS time corresponding to the zero crossing to produce a reference time. This reference time is then made available to one or more remote generators via the communication channel. At a remote generator, the reference time is used to calculate a series of subsequent zero crossing times such that the remote timing processor can provide indications of speed differences and phase angle differences.

Global positioning satellite systems ("GPS") are well known in the art. Such systems typically consist of a constellation of satellites in earth orbit. Each satellite includes a highly accurate clock and periodically transmits, among other things, time codes back towards earth. By processing the differences in time delay of the signals received from several satellites, it is possible to calculate the position of a receiver in three dimensions. With regard to the present invention, however, the value of the GPS system lies in the fact that clocks at multiple sites, virtually anywhere in the world, may be precisely synchronized, through received GPS time codes. It is generally held that two or more clocks may be synchronized within 350 nanoseconds of each other, independent of their respective locations.

With this in mind, and since the frequency of the power on the grid is known, e.g. 60 Hz in the United States, one can calculate the precise time at which future zero crossings should occur from the reference time transmitted from the host timing processor. Synchronizing a remote generator such that it produces zero crossings at these times may be performed by techniques which are presently used to synchronize generators to a bus and which are well known in the art.

In another preferred embodiment, the host timing processor calculates reference times with no physical connection to the grid. Since the precise frequency of the grid is known, it is possible to synchronize every generator on the grid to an external reference, as opposed to drawing the reference from the grid. Preferably, the host timing processor would include a GPS receiver through which the processor can receive current GPS time. The timing processor then selects a time for a first zero crossing and calculates the time for subsequent zero crossings. The reference time for each subsequent zero crossing would then be transmitted over the communication channel as it occurs.

It should be noted that, in either of the above mentioned embodiments, since the reference is remote to the local generator, synchronization will be less influenced by the synchronized generator than by power on the grid from other sources. With the frequency of the generator thus controlled, inadvertent interchanges due to a loss of synchronization may be virtually eliminated.

In still another preferred embodiment, power line monitors are placed at predetermined locations within the grid, for example at power plants. Each power line monitor includes a GPS receiver which continuously provides GPS time. When a disturbance is observed on the power line, GPS time is recorded along with the nature of the disturbance. If the disturbance is caused by a fault in the grid, arrival times from two or more locations are compared to calculate a difference in the arrival times from which a position of the fault can be determined.

Further objects, features, and advantages of the present invention will be apparent to those skilled in the art upon examining the accompanying drawings and upon reading the following description of the preferred embodiments.

DESCRIPTION OF THE PREFERRED EMBODIMENTS

Before explaining the present invention in detail, it is important to understand that the invention is not limited in its application to the details of the construction illustrated and the steps described herein. The invention is capable of other embodiments and of being practiced or carried out in a variety of ways. It is to be understood that the phraseology and terminology employed herein is for the purpose of description and not of limitation.

Figure 1:
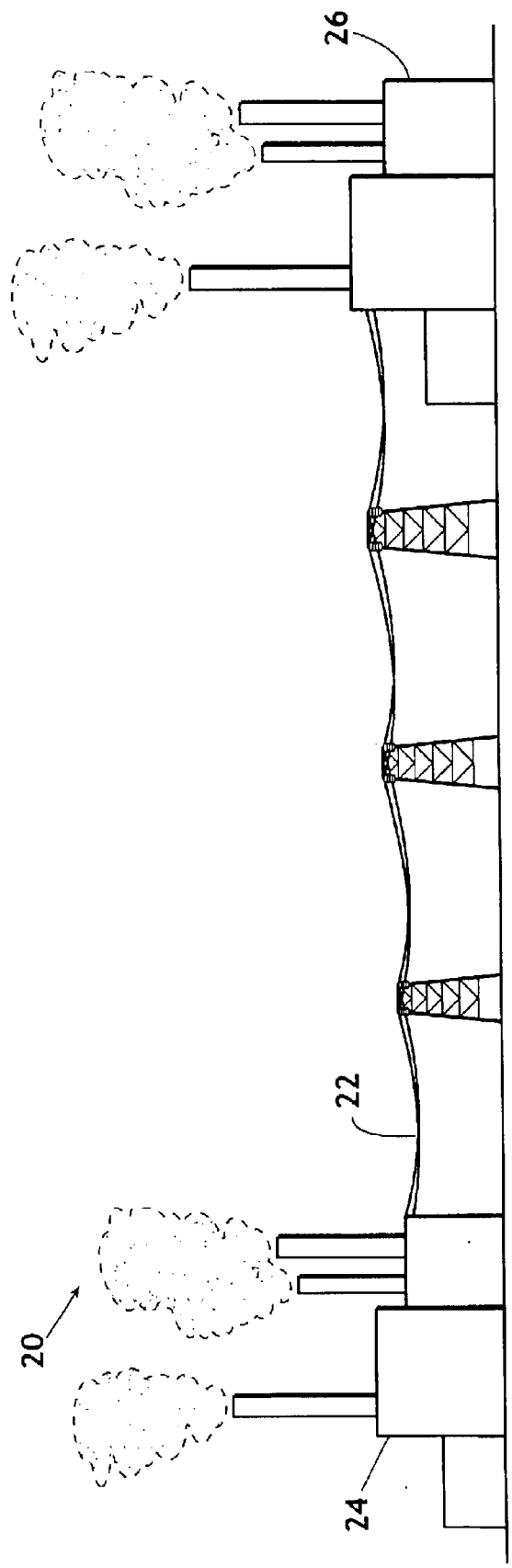
FIG. 1 depicts the general environment in which the inventive system and method are used.

Referring now to the drawings, wherein like reference numerals indicate the same parts throughout the several views, the inventive system is shown in its general environment in FIG. 1. Typically, a grid 20 is formed by a network of transmission lines 22. The grid 20 is used to transmit electrical power from generating facilities, i.e. power plants 24 and 26, to customers or end users. For a number of reasons, a grid, whether local, regional, or national, usually includes connections to multiple power plants. As discussed hereinabove, all power plants connected to grid 20 are ideally operating in synchronization and each power plant must be synchronized to grid 20 before being placed on-line. Synchronization requires a generator to produces electricity at precisely the same frequency as the power present on grid 20 and precisely in phase with grid 20.

Figure 3:
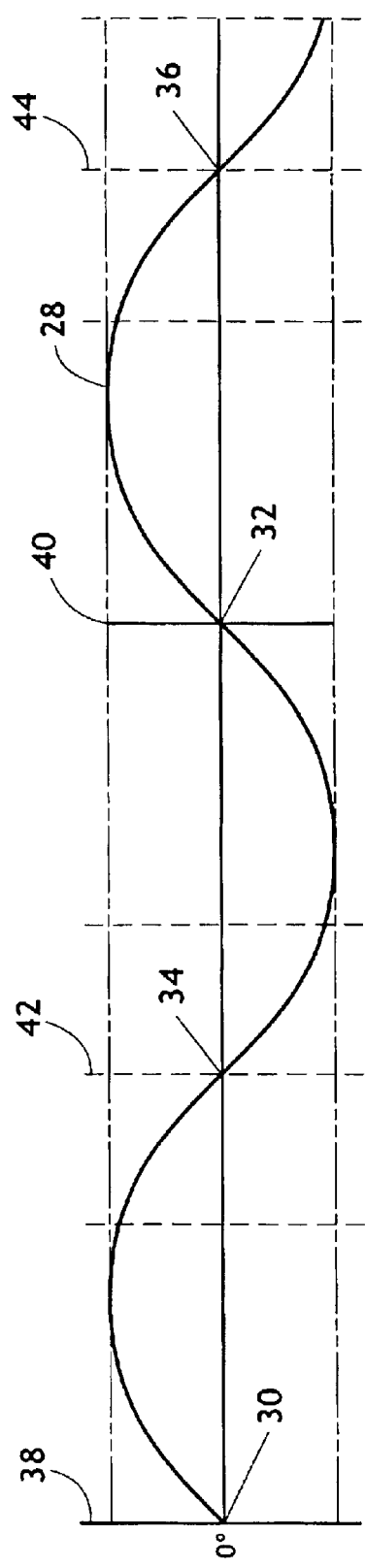
FIG. 3 depicts the waveform of a single phase of electrical power as typically produced by a power plant.

Referring next to FIG. 3, typically the electrical power present on a grid, such as grid 20, is in the form of a sine wave 28 of a fixed frequency, for example, 60 Hz in the United States. As will be apparent to those skilled in the art, sine wave 28 undergoes a zero crossing at zero degrees as shown at points 30 and 32 occurring at times 38 and 40, respectively, and at 180 degrees as shown at points 34 and 36 occurring at times 42 and 44, respectively. To be synchronized with the voltage represented by sine wave 28, a generator must produce electrical voltage which also has positive-going zero crossings at times 38 and 40 and negative-going zero crossings at times 42 and 44.

Figure 4:
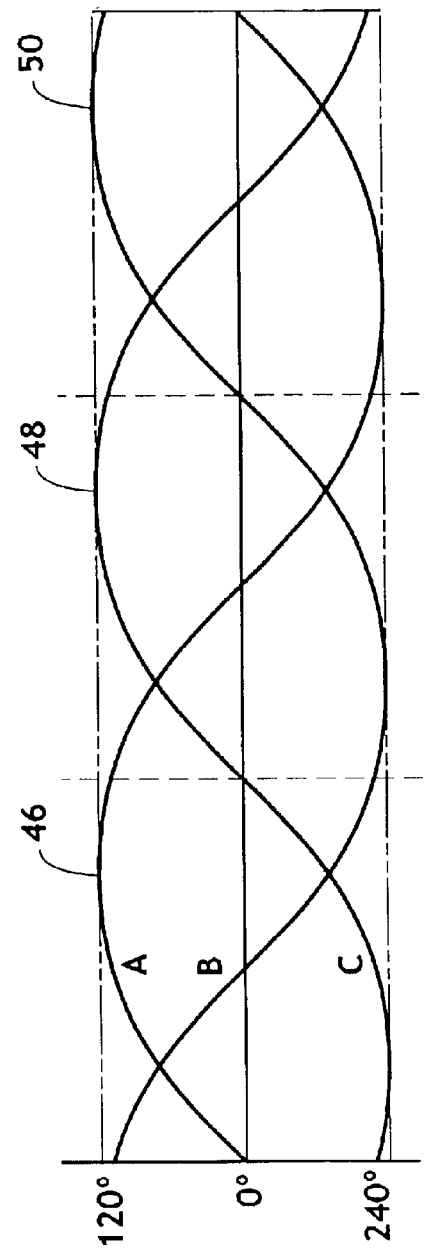
FIG. 4 depicts the waveform of three-phase electrical power as typically produced by a power plant.

Turning next to FIG. 4, synchronization is confused somewhat by the fact that, more specifically, power plants produce three-phase power. In practice, a generator will be wound with three sets of coils, each set of coils being rotationally offset 120 degrees from the next. As a magnetic field is rotated in the generator, as with a turbine or an engine, an AC voltage will be produced in each coil with a 120 degree offset between each sine wave. Thus, if a first coil produces power on phase-A as indicated by graph 46, a second coil will produce power on phase-C, as indicated by graph 48, which is delayed from phase-a by 120 degrees, and a third coil will produce power on phase-B, as indicated by graph 50, which is delayed from phase-A by 240 degrees, or can be thought of as leading phase-A by 120 degrees. Obviously when connecting a generator to a grid, the appropriate sequencing of phases is also an important consideration. However, it should be noted that this is typically a consideration only when initially connecting the generator and, once the proper sequence is established, never a consideration in synchronizing the generator to the bus.

Figure 5:
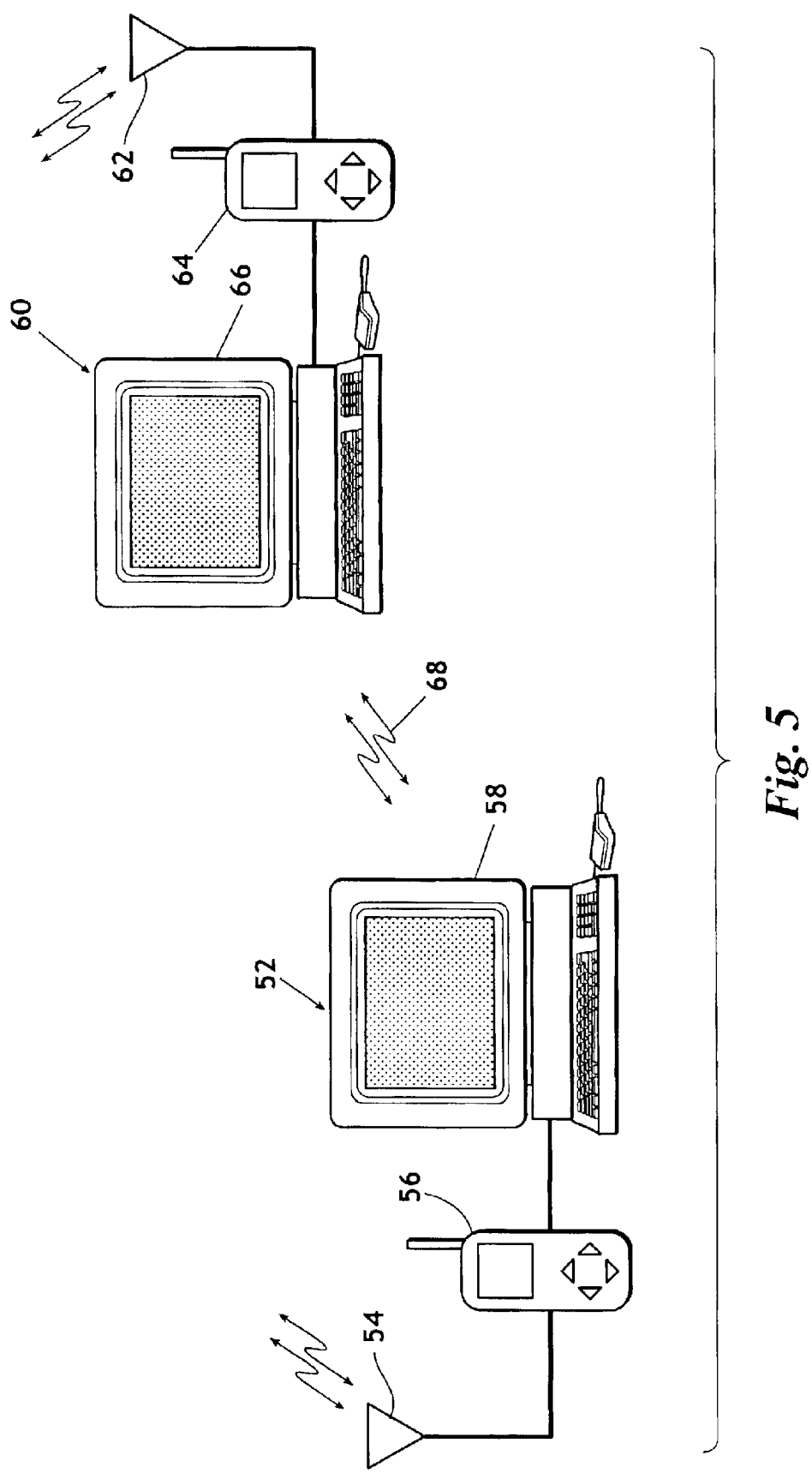
FIG. 5 provides a diagram of the system for synchronizing a generator to an off-line reference.
Figure 6:
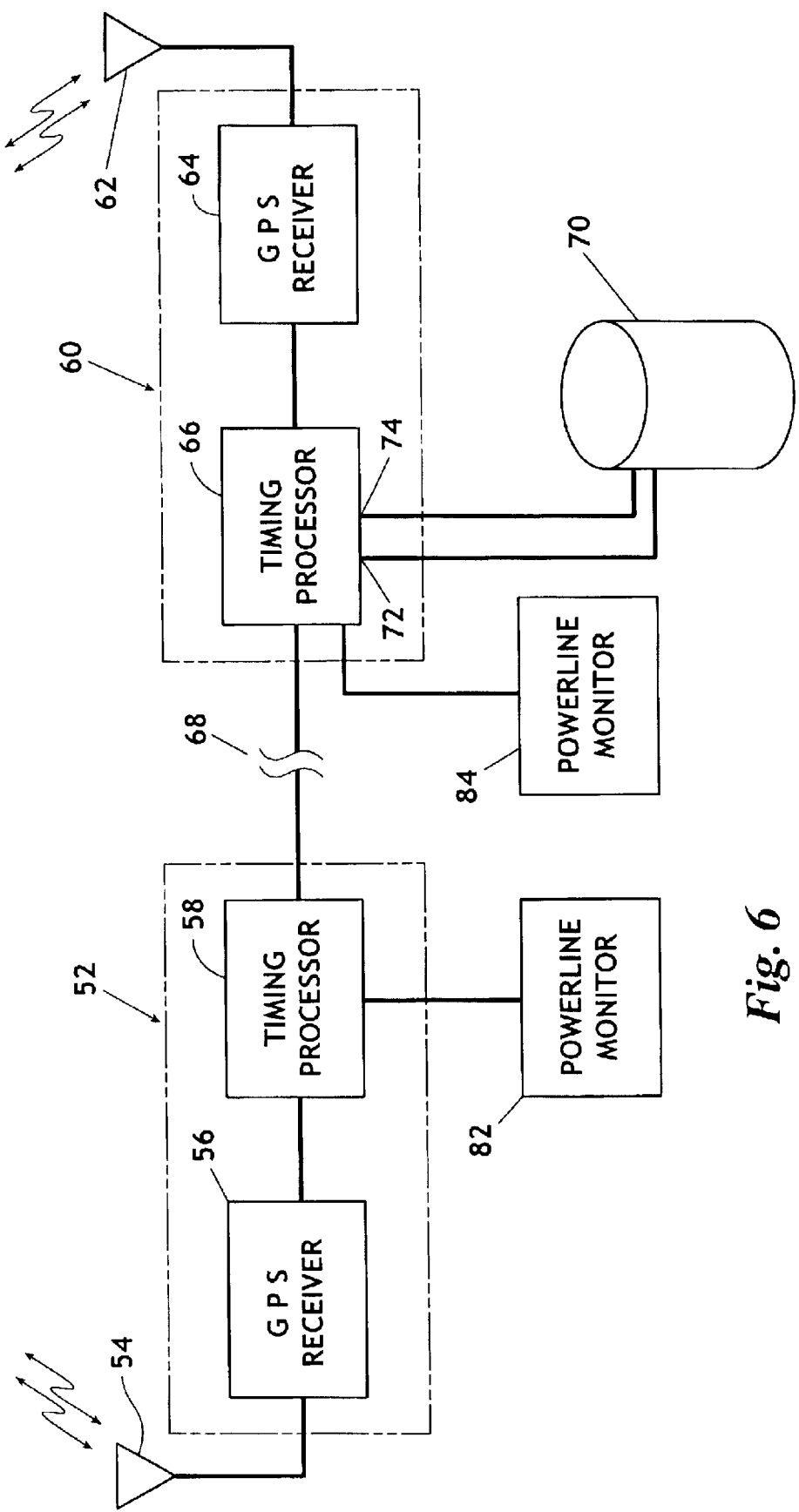
FIG. 6 provides a block diagram of the system for performing synchronization of a generator to a bus in accordance with the present invention.

Referring now to FIGS. 5 and 6, a host site 52 preferably includes: a GPS antenna 54 placed at a fixed location; a GPS receiver 56 configured to provide precise timing information; and a timing processor 58, which records the precise GPS time of zero crossings on the power line. A remote site 60 includes: a GPS antenna 62 preferably placed at a fixed location; a GPS receiver 64 also configured to provide precise timing information; and a timing processor 66. At remote site 60, timing processor 66 receives time codes from host site 52 over communication channel 68. The rotational position of the rotor of generator 70 is received by timing processor 66 at input 72. The speed of generator 70 is modulated by output 74 to control the rotation of generator 70 to produce electricity at the precise frequency and in phase with the reference provided by host 52.

Communication channel 68 may be virtually any medium over which numerical information may be transmitted, preferably a telephone line or the Internet. As will be appreciated by those skilled in the art, since the precise frequency of the power line is known, after the time of the reference crossing is received, subsequent zero crossings may be calculated out several seconds before the phase shift between the actual zero crossings and theoretical zero crossings could differ significantly. Thus, the latency of the communication channel is of little or no concern in the operation of the inventive system. By way of example and not limitation, other examples of suitable communication channels include: conventional radio systems; cellular phones; local area networks; wide area networks; dedicated wires; subcarrier transmission over an FM radio station transmission; power line communication; etc.

Figure 7:
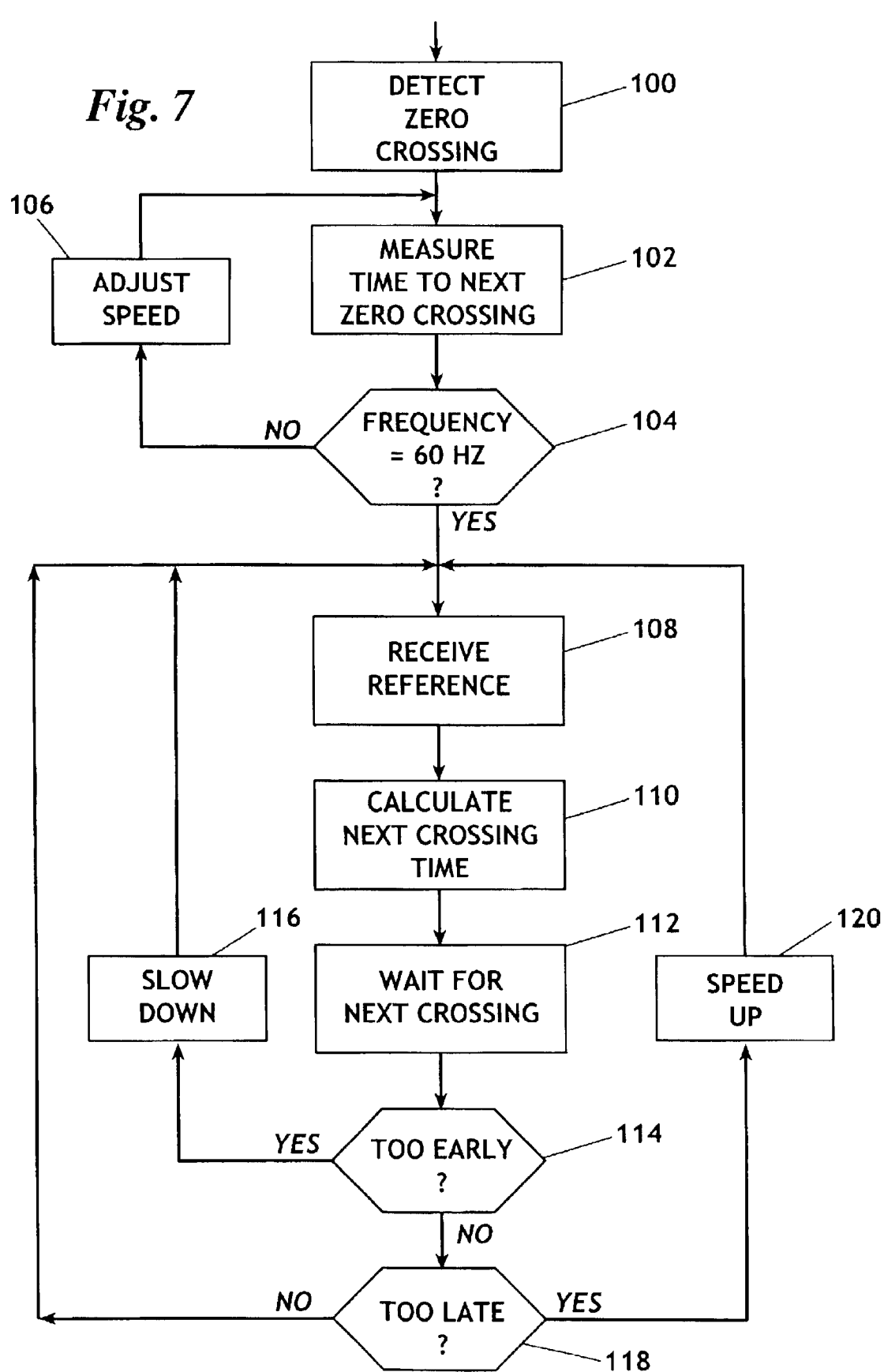
FIG. 7 provides a flow chart of a method for synchronizing a generator to a received reference.

While methods of determining the frequency of the output of a generator and the phase angle relative to a reference are well known in the art, a flow chart for one method for synchronizing is shown in FIG. 7. As will be apparent to those skilled in the art, the system depicted in FIG. 7 is well suited to either an embodiment in dedicated hardware, or embodied in a software program executed in a computer. First, whether derived from the power generated by the generator or provided from a tachometer, the position of the rotor of the generator is converted to a square wave, preferably with the transitions of the square wave corresponding to zero crossings of the AC output of the generator. First, a zero crossing is detected at 100 and the time to the next zero crossing is measured at 102 to determine the period of each cycle of the square wave. This period is compared to a reference corresponding to the desired frequency to be generated at 104. The generator speed is adjusted at 106 until the generator is operating at the precise speed to produce the desired frequency.

Once the desired frequency is attained at step 104, a reference time is received from the host system corresponding to a zero crossing at step 108 and used to calculate the next zero crossing time at step 110. As previously noted, it is possible that communication delay could cause the reference time to be several cycles old. Since absolute time is known at the remote site, the next zero crossing can still be calculated from the reference time. After waiting for the next zero crossing at 112, if the zero crossing occurred too early at 114 the generator speed is bumped slightly slower at 116. If the zero crossing arrived too late at 118, the generator speed is bumped up slightly at step 120. If the zero crossing arrived at precisely the right time, the system simply returns to step 108 to wait for the next reference.

It should be noted that the inventive synchronization scheme can be used to regulate the frequency of the generator on a continuous basis, even after connection to the bus. As will be apparent to those skilled in the art, under prior art schemes, the waveform present on the bus at the generator is heavily influenced by the generator itself making continuous synchronization to the bus virtually impossible. Such systems relied on the tendency of the generator to remain synchronized after connection. In contrast, the reference signal for synchronization under the present invention may be artificially created, as where the entire grid synchronizes to a standard source, or the reference may be drawn from a point on the grid where the local generator will not exhibit undue influence on the measurement. Thus, synchronization may be performed in a continuous, on-going manner and losses associated with lapses in synchronization may be virtually eliminated.

In addition to synchronization, the inventive system may be used to determine the location of faults in a power line. It is well known in the art that measurable disturbances occur on a electrical transmission line upon the occurrence of a fault, i.e, a broken line, a short circuit, a failed transformer, etc. Such disturbances are typically visible even miles from the location of the fault. The recognition and measurement of such disturbances with a power line monitor are also well known in the art. If the clocks of two, or more, power line monitors are precisely synchronized, it is possible to determine a location of the fault by comparing the arrival times at the different monitors. It should be noted that, since disturbances propagate the transmission line at the speed of light, even small differences in the clocks of two monitors can result in huge errors in the calculation of the location of the fault.

Synchronizing clocks at two or more locations through the use of GPS timing signals is known in the art. While the initial synchronization of multiple clocks may take some time, it is generally held that, once synchronized, multiple clocks may be held in synchronization to within 350 nanoseconds of each other using GPS signals, anywhere in the world. Accordingly, a fault may be pin pointed to within 344 feet of its actual location. If the clocks of the monitors are synchronized within 80 nanoseconds, as specified by some providers of GPS time clocks, a fault could be identified within 79 feet of its actual location.

Figure 2:
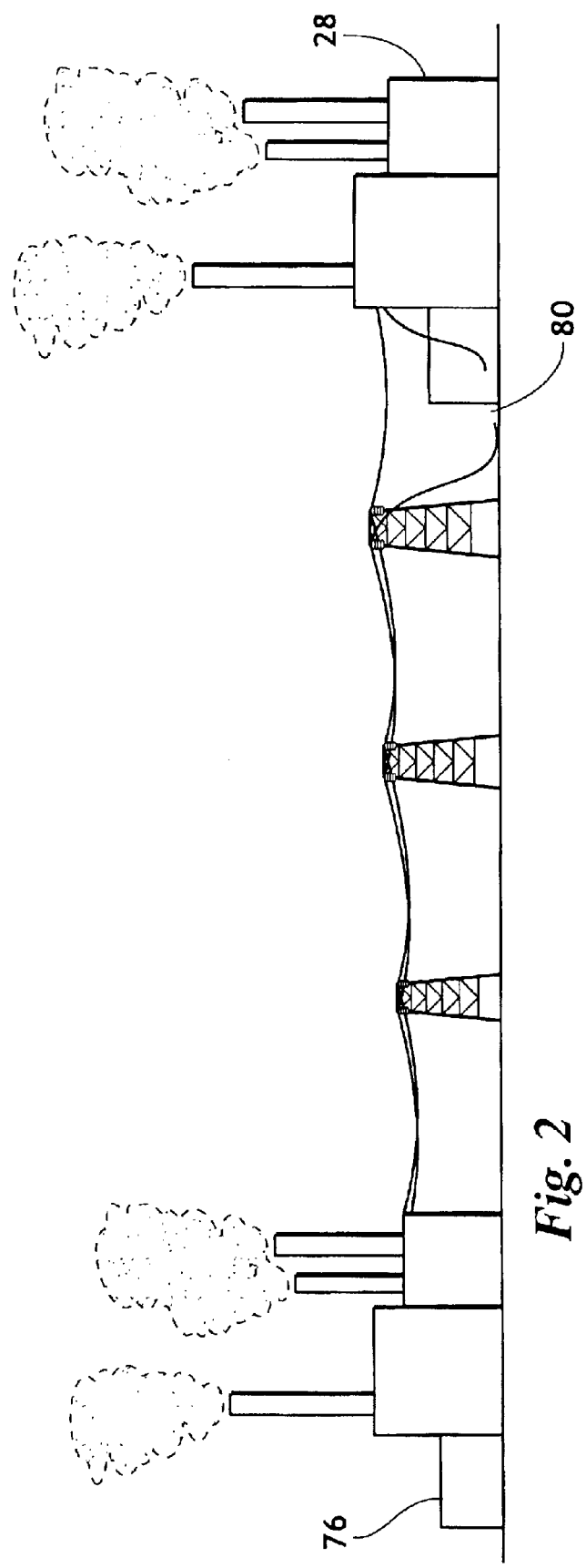
FIG. 2 depicts the general environment in which the inventive system and method are used with a fault in a transmission line.

Continuing with FIG. 6, and with further reference to FIG. 2 if, by way of example, power line monitor 82, preferably as a part of host system 52, is located at power plant 76 and power line monitor 84, preferably as a part of remote system 60, is located at power plant 78, upon the occurrence of the fault at location 80, a disturbance will be produced which will be recognized and logged by timing processor 58 at power plant 76 and by timing processor 66 at power plant 78. Since the distance between plants 76 and 78 is known, location 80 can be calculated by the difference in the arrival times of the disturbances between plants 76 and 80. Assuming power plant 76 is located at $X_1$ and power plant 78 is located at $X_2$, the position of a fault is given by:

$$X_1 + X_2 = d$$

and $$X_1 - X_2 = (t_1 - t_2) * c$$

where:

d is the distance between power plants 76 and 78;

$t_1$ is the arrival time of the disturbance at power plant 76;

$t_2$ is the arrival time of the disturbance at power plant 78; and c is the speed of light.

As will be appreciated by those skilled in the art, there will sometimes be multiple paths from a fault to a given monitor. While such a situation may somewhat complicate the process of calculating a location, where three or more monitors are involved, applying the equations provided above to pairs of monitors will still quickly yield an accurate position.

It should be noted that, while the preferred embodiment relies on GPS time to synchronize clocks at two or more locations, the invention is not so limited. GPS time is presently available and equipment exists to harness the transmitted information to synchronize clocks at different locations with sufficient accuracy to practice the present invention. However, the inventive system could employ any system for synchronizing clocks as long as the clocks are held in synchronization with sufficient tolerance to allow satisfactory synchronization of the generator or to pin point a fault with sufficient accuracy. For example, if a generator could tolerate a five degree phase shift when being placed on-line, the clocks at the host and remote sites would only need to be synchronized within about 230 microseconds of one another. When used for fault location, one can quickly estimate the accuracy of the system by assuming about one foot of uncertainty per nanosecond of inaccuracy of the clock. Thus if the clocks are only synchronized to within one microsecond, there would be about 1000 feet of uncertainty with regard to the position of a fault. Suitable accuracy to practice the present invention could be obtained by the transmission of a time code, either via dedicated wires or wirelessly, as long as the distance between the transmitter and the receiver could be ascertained with the requisite degree of accuracy to synchronize clocks at the two locations.

Thus, the present invention is well adapted to carry out the objects and attain the ends and advantages mentioned above as well as those inherent therein. While presently preferred embodiments have been described for purposes of this disclosure, numerous changes and modifications will be apparent to those skilled in the art. Such changes and modifications are encompassed within the spirit of this invention.

What is claimed is:

1. A system for synchronizing an electrical generator to a remote bus comprising:

a first timing processor having a first clock, said first timing processor configured to provide time codes corresponding to a fixed point in the waveform of the electricity available on the bus;

a second timing processor having a second clock operating in synchronization with said first clock, said second timing processor configured to receive time codes from said first timing processor and to adjust the output of the electrical generator to synchronize the output with the electricity available on the bus; and a communication channel between said first timing processor and said second timing processor for the transmission and reception of said time code.

2. The system for synchronizing a generator to a remote bus of claim 1 wherein said first clock and said second clock indicate GPS time.

3. The system for synchronizing a generator to a remote bus of claim 1 wherein said communication channel is the internet.

4. The system for synchronizing a generator to a bus of claim 1 wherein said communication channel is a telephone line.

5. A method for synchronizing a generator to a bus including the steps of:

(a) synchronizing a first clock at a generator with a second clock at a host site;

(b) obtaining the time corresponding to a first fixed point in the waveform of the electricity on the bus from said second clock;

(e) transmitting said time to the generator;

(d) calculating a time when a second fixed point should occur in the waveform of the electricity produced by the generator;

(e) adjusting the speed of the generator such that said second fixed point will occur at the time calculated in step (d).

6. The method for synchronizing a generator to a bus of claim 5 including the further step of:

(f) repeating steps (a)–(e) in a continuous manner.

\* \* \* \* \*